United States Patent
Koole et al.

(10) Patent No.: US 10,050,184 B2
(45) Date of Patent: Aug. 14, 2018

(54) QUANTUM DOTS WITH REDUCED SATURATION QUENCHING

(71) Applicant: KONINKLIJKE PHILIPS N.V., Eindhoven (NL)

(72) Inventors: Roelof Koole, Eindhoven (NL); Manuela Lunz, Waalre (DE); Dirk Veldman, Eindhoven (NL); Patrick John Baesjou, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/304,978

(22) PCT Filed: Apr. 8, 2015

(86) PCT No.: PCT/EP2015/057536
§ 371 (c)(1),
(2) Date: Oct. 18, 2016

(87) PCT Pub. No.: WO2015/162003
PCT Pub. Date: Oct. 29, 2015

(65) Prior Publication Data
US 2017/0207370 A1    Jul. 20, 2017

(30) Foreign Application Priority Data

Apr. 25, 2014    (EP) .................................. 14165934

(51) Int. Cl.
*G02F 1/35*        (2006.01)
*H01L 33/50*       (2010.01)
*G02F 2/02*        (2006.01)

(52) U.S. Cl.
CPC .......... *H01L 33/502* (2013.01); *H01L 33/507* (2013.01); *H01L 2933/0083* (2013.01)

(58) Field of Classification Search
None
See application file for complete search history.

(56) References Cited

U.S. PATENT DOCUMENTS 7,550,095 B2 * 6/2009 Fiedler ............... C09K 11/7728
                                                       252/301.4 F
7,700,936 B2 * 4/2010 Murakowski .......... B82Y 10/00
                                                       257/103

(Continued)

FOREIGN PATENT DOCUMENTS

WO    2009035657 A1    3/2009
WO   20100014198 A1    2/2010
WO    2011031871 A1    3/2011

OTHER PUBLICATIONS

EPO as ISA, International Search Report and Written Opinion dated May 21, 2015 from International Application No. PCT/EP2015/057536, filed Apr. 8, 2015, 15 pages.

Soganci et al., "Localized plasmon-engineered spontaneous emission of CdSe/ZnS nanocrystals closely-packed in the proximity of Ag nanoislands", Lasers and Electro-Optics Society, Oct. 2007, pp. 14289-14298.

(Continued)

*Primary Examiner* — Rhonda Peace

(57) ABSTRACT

The invention provides a lighting device comprising (a) a light converter comprising a light receiving face; and (b) a solid state light source configured to generate a light source light with a photon flux of at least 10 W/cm² at the light receiving face, wherein the light converter is configured to convert at least part of the light source light into light converter light having a first frequency, wherein the light converter comprises a semiconductor quantum dot in an optical structure selected from a photonic crystal structure and a plasmonic structure, wherein the optical structure is configured to increase the photon density of states in the light converter resonant with the first frequency for reducing saturation quenching, and wherein the quantum dot has a quantum efficiency of at least 80%.

9 Claims, 4 Drawing Sheets

(56) References Cited

U.S. PATENT DOCUMENTS

| | | | |
|---|---|---|---|
| 8,105,502 B2* | 1/2012 | Fukuda | C04B 35/584 252/301.4 F |
| 8,670,471 B2* | 3/2014 | Kim | B82Y 20/00 372/21 |
| 9,136,498 B2* | 9/2015 | Skipor | B82Y 20/00 |
| 9,627,592 B2* | 4/2017 | Skipor | H01L 33/502 |
| 2005/0285128 A1 | 12/2005 | Scherer et al. | |
| 2007/0025673 A1 | 2/2007 | Bose et al. | |
| 2010/0021104 A1 | 1/2010 | Yamagiwa et al. | |
| 2010/0045163 A1* | 2/2010 | Winkler | C09K 11/685 313/486 |
| 2010/0051870 A1 | 3/2010 | Ramprasad | |
| 2017/0207370 A1* | 7/2017 | Koole | H01L 33/502 |

OTHER PUBLICATIONS

Pompa et al., "Metal-enhanced fluorescence of colloidal nanocrystals with nanoscale control", Nature Nanotechnology, vol. 1, No. 2, Nov. 2006, pp. 126-130.

Song et al., "Large Enhancement of Fluorescence Efficiency from CdSe/ZnS Quantum Dots Induced by Resonant Coupling to Spatially Controlled Surface Plasmons", Nano Letters, vol. 5, No. 8, Aug. 2005, pp. 1557-1561.

Article 94(3) EPC dated Jul. 6, 2017, European Application No. 15713784.5, LUM Reference No. 2014P00179WE, 7 pages.

First Office Action dated Oct. 18, 2017, China application No. 201580022040.9, 19 pages.

Article 94(3) EPC dated Feb. 27, 2018, European Application No. 15713784.5, 6 pages.

* cited by examiner

QUANTUM DOTS WITH REDUCED SATURATION QUENCHING

CROSS-REFERENCE TO RELATED APPLICATIONS

The present application is a § 371 application of International Application No. PCT/EP2015/057536 filed on Apr. 8, 2015 and entitled "QUANTUM DOTS WITH REDUCED SATURATION QUENCHING," which claims priority to European Patent Application No. 14165934.2, filed Apr. 25, 2014. Applications PCT/EP2015/057536 and EP14165934.2 are incorporated herein.

FIELD OF THE INVENTION

The invention relates to a lighting device comprising a light converter, wherein the light converter comprises semiconductor quantum dots. The invention further relates to such light converter.

BACKGROUND OF THE INVENTION

The application of quantum dots for lighting is known in the art. US2008315177, for instance, describes devices and methods for emitting substantially white light using a photonic crystals. The photonic crystal has a lattice of air holes and is made from a substrate containing quantum dots. The substrate is etched with three defects that are optically coupled together so that each emits only certain frequencies of light. In combination, the defects can produce substantially white light. The parameters of the photonic crystal are dimensioned so as to cause the coupling between the defects to produce substantially white light.

US2007/025673 describes light emission using quantum dot emitters in a photonic crystal. This documents describes devices and methods of manufacturing for emitting substantially white light using a photonic crystal. The photonic crystal has a lattice of air holes and is made from a substrate containing quantum dots. The substrate is etched with three defects that are optically coupled together so that each emits only certain frequencies of light. In combination, the defects can produce substantially white light. The parameters of the photonic crystal are dimensioned so as to cause the coupling between the defects to produce substantially white light.

US2010/021104 describes an optical waveguide system. It further describes that it is made possible to provide an optical waveguide system that has a coupling mechanism capable of selecting a wavelength and has the highest possible conversion efficiency, and that is capable of providing directivity in the light propagation direction. An optical waveguide system includes a three-dimensional photonic crystalline structure including crystal pillars and having a hollow structure inside thereof, an optical waveguide in which a plurality of metal nanoparticles are dispersed in a dielectric material, the optical waveguide having an end portion inserted between the crystal pillars of the three-dimensional photonic crystalline structure, and containing semiconductor quantum dots that are located adjacent to the metal nanoparticles and emit near-field light when receiving excitation light, the metal nanoparticles exciting surface plasmon when receiving the near-field light; and an excitation light source that emits the excitation light for exciting the semiconductor quantum dots.

Ibrahim Murat Soganci et al. (IEEE, Lasers and Electro-Optics Society, 2007, p. 533-534) describes a localized plasmon-engineered spontaneous emission of CdSe/ZnS nanocrystals closely-packed in the proximity of Ag nano islands.

P. P. Pompa et al. (Nature Nanotechnology, vol. 1, no. 2, November 2006, p. 126-130) describes a metal-enhanced fluorescence of colloidal nanocrystals with nanoscale control.

Jung-Hoon Song et al. (Nano Letters, vol. 5, no. 8, August 2005, p. 1557-1561) describes a large enhancement of fluorescence efficiency from CdSe/ZnS Quantum dots induced by resonant coupling to spatially controlled surface plasmons.

US2005/285128 describes a surface plasmon light emitter structure and method of manufacture. This document describes a method (and resulting structures) for manufacturing light emitting semiconductor devices. The method includes providing a substrate comprising a surface region and forming a metal layer overlying the surface region of the substrate. In a specific embodiment, the metal layer and the surface region are characterized by a spatial spacing between the metal layer and the substrate to cause a coupling between electron-hole pairs generated in the substrate and a surface plasmon mode at an interface region between the metal layer and the surface region. Additionally, the interface region has a textured characteristic between the surface region and the metal layer. The textured characteristics causes emission of electromagnetic radiation through the surface plasmon mode or like mechanism according to a specific embodiment.

US2010/0051870 describes a semiconductor nanocrystals and compositions and devices including same. This document further describes a semiconductor nanocrystal capable of emitting light with an improved photoluminescence quantum efficiency. US2010/0051870 further relates to compositions and devices including semiconductor nanocrystals capable of emitting light with an improved photoluminescence quantum efficiency. A semiconductor nanocrystal wherein the semiconductor nanocrystal is capable of emitting light with a photoluminescence quantum efficiency greater than about 50% upon excitation and including a maximum peak emission with a FWHM less than 20 nm is disclosed. US2010/0051870 also describes are a device, a population of semiconductor nanocrystals, and a composition including a semiconductor nanocrystal wherein the semiconductor nanocrystal is capable of emitting light with a photoluminescence quantum efficiency greater than about 50% upon excitation and including a maximum peak emission with a FWHM less than 20 nm. A semiconductor nanocrystal that is capable of emitting light upon excitation with a photoluminescence quantum efficiency greater than about 90%.

SUMMARY OF THE INVENTION

Quantum dots (qdots or QDs or QD nano crystals) are currently being studied as phosphors in solid state lighting (SSL) applications (LEDs). They have several advantages such as a tunable emission and a narrow emission band which can help to significantly increase the efficacy of LED based lamps, especially at high CRI. The narrow emission band (25-30 nm) and high QE (>90% at 100° C.) makes them superior phosphors especially in the red (around 610 nm), where alternative inorganic and organic phosphors show a much broader emission band. An overall improvement up to 20% in efficacy is expected in case QDs can be used as red phosphor in LEDs for general lighting applications. For backlight application the gain in efficacy can be even more, because the narrow band emission of both green and red QDs can be matched with the band pass filter of the LCD. All in all, QDs are envisaged to be important green and/or red phosphors for LED applications in the next years.

Quantum dots are semiconductor nanoparticles and exhibit tunable fluorescence by changing the size of the nanoparticles. This is a result of an increase in the bandgap for reducing particle size due to quantum confinement effects. The fluorescence in a QD occurs via excitation of an electron-hole pair by for example a blue or UV photon. The bound electron-hole pair is also called an exciton. After excitation, the electron and hole typically relax thermally (or "cool") to the band edge states by interaction with the lattice (phonon coupling). The exciton can subsequently recombine radiatively, where it emits a photon with an energy approximately equivalent to the bandgap of that QD. Alternatively, the exciton can recombine non-radiatively, for example because the electron or hole is trapped (and recombines through a non-radiative path), or because the energy is transferred to another oscillating dipole nearby (e.g. another QD, metal, etc.). The overall quantum efficiency (QE) of the QD can therefore be defined as:

$$QE = \Gamma_{rad}/(\Gamma_{rad} + \Gamma_{nonrad}) \quad \text{(equation 1)}$$

where $\Gamma_{rad}$ is the radiative decay rate, and $\Gamma_{nonrad}$ is the non-radiative decay rate. In case the non-radiative decay rate is much faster than the radiative decay rate, the QE will be low. In other words, if QDs exhibit a very high QE, e.g. 90%, it implies that the non-radiative decay rate is ~10 times slower than the radiative decay rate (that is in case all QDs in the ensemble are the same; another possibility is that 1 out of 10 QDs is "dead" because it has a very fast non-radiative decay path).

When QDs are excited with high intensity, it is possible to create more than one exciton per QD. The radiative rate of QDs is typically 20 ns, and if within the 20 ns after the first excitation a second excitation occurs, a QD may have two excitons. Recent literature shows that an Auger process is likely to occur in the case of two excitons or in the case of an exciton and a single electron or hole ("trion"). The Auger process in this case means that the $1^{st}$ exciton recombines non-radiatively, by transferring its energy to the $2^{nd}$ exciton (or electron or hole). This causes an excitation of either the hole or electron (of the $2^{nd}$ exciton) higher up in the band, which will be called a "hot electron" or "hot hole" here. The hot electron or hole subsequently relaxes thermally to the band edge states again, resulting in net 1 exciton. That remaining exciton can recombine radiatively by emitting a photon. Overall, the QE has thus reduced to 50% of the initial QE of the QD, since two photons were used to excite two excitons, but results in 1 emitted photon after all. The Auger process has a certain rate ($\Gamma_{Auger}$), which competes with the radiative recombination. In other words, the Auger process is an example of a non-radiative decay pathway which can reduce the QE if it is fast. Unfortunately, the Auger process in QDs is very fast (hundreds of picoseconds up to 1-2 ns lifetime) compared to the radiative decay time (20 ns). Hence, double excitons will most likely have a 50% reduced QE.

In addition to the process described above, there is also the so-called Auger ionization process that can occur in the case of a biexciton. The hot electron or hot hole can exhibit so much energy (2 eV above the band edge) that it can be "ejected" to outside the QD (or to the surface). The result is a charged QD, and it is generally believed that charged QDs are responsible for the so-called blinking behavior of QDs; once a charged QD is excited, the resulting "trion" will also undergo Auger recombination resulting in the charged QDs again. Hence, a charge QD does not emit light, and is in the so-called "off state". Once the QD becomes neutral again (literature does not describe how), the QD is in the "on state". Switching between the "on" and "off" state is generally observed in single-QD spectroscopy, and is called blinking. In summary, Auger ionization may be the mechanism responsible for blinking to occur (i.e. for QDs to get charged). Blinking happens on a ms time-scale and effectively lowers the QE.

It is proposed here that in addition to blinking, the Auger ionization process may also be responsible for QD degradation. The ejected hole or electron may be prone to further reaction with the material surrounding the QD, making neutralization impossible (i.e. permanent off-state). Alternatively, the ejected electron or hole may induce a further degradation mechanism.

The formation of biexcitons is not desired because it may cause Auger recombination which results in reduced QE, it may cause Auger ionization which results in blinking, which effectively reduces QE, and it may cause Auger ionization which may be a cause for QD degradation.

An important aspect of the invention is that saturation of QDs occurs at blue intensities that are relevant for LED applications. A short calculation is given below, where the following is given:

The absorption cross-section ($\sigma$) is a measure for how well QDs absorb light, and given in $cm^2$. The $\sigma$ of QDs depends on its (core/shell) structure and size. In the literature, a $\sigma$ of $4E^{-15}$ $cm^2$ for CdSe/CdS core/shell QDs with an emission around 600 nm is described. However, these QDs are 4.8 nm in size, where core-shell QDs typically are 7.5 nm (or larger, up to 20 nm). Assuming that CdS has approximately the same a as CdSe, and correcting for size, it is calculated that typical core/shell QDs of 7.5 nm diameter have a $\sigma$ of $\sim 1.5E^{-14}$ $cm^2$.

The radiative decay time $\tau$ of QDs is typically 20 ns (radiative decay time $\tau$ is the inverse of radiative rate $\Gamma_{rad}$ mentioned above).

The photon flux F ($cm^{-2}$ $s^{-1}$) is the amount of photons that passes a certain area per second. At a wavelength of 450 nm (photon energy of $4.4E^{-19}$ J), and a blue flux density of 10 $W/cm^2$, the photon flux $F = 2.3E^{19}$ photons/s/$cm^2$ The fraction of excited states (U) is defined as $$U = F*\tau*\sigma \quad \text{(equation 2)}$$

and it is a measure for the fraction of time a single QD is in the excited state at a certain flux density, but can also be seen as the fraction of QDs of an ensemble that is in an excited state at a given moment in time. (and is a unit-less number).

Using equation 2 above, the fraction of time a QD is in the excited state at a flux density of 10 $W/cm^2$ can be calculated to be ~0.007, for QDs with $\sigma \sim 1.5E-14$ $cm^2$ and $\tau = 20$ ns. This implies that a QD is in the excited state for roughly 1% of its time at this flux density (or almost 1% of the QDs is in the excited state at a given moment in time). It is clear from equation 2 that there is a linear relation between the fraction of excited states and the flux density.

It can be seen that at 100 $W/cm^2$, 7% of the QDs is in the excited state (or a QD is in its excited state for 7% of its time). An important fact to note is that the absorption cross section of QDs at 450 nm does not change if it is in the excited state. Hence, at 100 $W/cm^2$, the chance that a QD is in an excited state while it absorbs a photon is 7% (resulting in a bi-exciton). Following the Auger process this bi-exciton results in only 1 emitted photon. Hence, the QE is lowered by 7% for this example. This lowering in QE at higher flux densities is referred to as saturation quenching.

It is stressed that the absorption cross-section of QDs becomes larger for so-called giant QDs, which are preferred for better stability. However, the increase in cross section means that the saturation quenching starts at even lower fluxes. For example, a giant QD can be as large as 15 nm instead of 7.5 nm. This means an 8-fold increase in the absorption cross-section (the absorption cross-section scales linearly with the QD volume). If the cross-section is increased by a factor of 8, the QE is quenched by ~6% (vs. 0.7%) at 10 W/cm$^2$ and 60% (vs. 7% for 7.5 nm QDs) at 100 W/cm$^2$.

As mentioned earlier, the Auger process does not only lead to quenching, but may also be responsible for degradation of QDs. Even at a relatively low level of U of 0.01 (1%), this may impact QD stability substantially.

In case UV-LEDs will be used, the problem of saturation becomes even larger, since the absorption cross-section of QDs increases rapidly when going from e.g. 450 nm to 365 nm (can be 5-10× larger).

Saturation (i.e. bi-excitons) of QDs can be circumvented by some pragmatic approaches, such as using mid-power LEDs, converting the blue light to yellow first (the cross-section of QDs for yellow is ~2-5× smaller), or to place QDs in a vicinity or remote configuration where the blue flux is "spreaded out". Alternatively, the shell-composition of QDs is made such that it absorbs less light. However, as this will lower the probability for a single QD to be excited, a larger number of QDs will be needed to achieve the same amount of conversion, and typically a thick shell is needed for good stability. Therefore, a more systematic solution to this problem is required to enable usage of QDs for high-power LED applications, ultra-high brightness sources, or even lasers.

Hence, it is an aspect of the invention to provide an alternative quantum dot based system, that can be used for quantum dots with high quantum efficiencies, which preferably further at least partly obviate one or more of above-described drawbacks, especially wherein efficiency (efficacy) loss is substantially reduced. Especially, it is an aspect of the invention to provide an alternative light converter, based on quantum dots and/or an alternative lighting device comprising such light converter.

It is proposed here to circumvent the formation of bi-excitons by reducing the radiative decay time ($\tau$) of QDs by locally increasing the photon density of states (PDOS) (at the quantum dot). According to Fermi's Golden Rule, the radiative decay rate is linearly dependent on the PDOS:

$$T_{i \rightarrow f} = 2\pi/h * M^2 * \rho \quad \text{(equation 3)}$$

where $T_{i \rightarrow f}$ is the transition probability (related to $\tau$), h is Planck's constant, M is the matrix element which deals with the optical transition (interaction between excited and ground state), and $\rho$ is the density of final states (i.e. PDOS).

In vacuum, the PDOS is a function of wavelength, and given by nature. However, there are means to locally increase the density of optical states, enabled by material developments in recent years. This can be achieved by photonic crystals and/or (periodic) plasmonic structures.

In the case of photonic crystals, the PDOS may e.g. be altered by a periodic structure of high and low refractive index materials. To affect the PDOS of visible light, the periodicity of the structure should be in the range of the wavelength of (visible) light, i.e. 350-750 nm. A photonic crystal can for example be made by placing transparent high-refractive index particles (such as $TiO_x$, $ZrO_2$, $Al_2O_3$, etc., with x in $TiO_x$ for instance (about) 2) in a regular periodic structure, surrounded by a matrix of air, or low-refractive index material (e.g. a silicone), but other options are also possible, such as a lattice of air holes and is made from a substrate containing quantum dots as described in the art. The regular structure can for example be achieved by self-assembly of particles in a hexagonal packing. Alternatively such a periodic structure can be made by nano-imprint techniques.

In the case of plasmonic structures, there is a strong local enhancement of electric fields. Examples are aluminum, silver, or gold nanoparticles, as examples of elements for creating plasmonic structures, which show strong resonance to the electric field of light in the visible range. The resonance causes a strong enhancement of the local electric field for a certain range of frequencies (wavelengths), which in effect is an increase in the local PDOS. Enhancement factors can be orders of magnitude. This implies that the radiative decay rate can be enhanced by orders of magnitude, and hence the formation of bi-excitons is circumvented or at least strongly reduced. The plasmonic material can also be structured to direct the local field enhancements in certain directions, as mentioned in the art. Plasmonic structures may be regular or irregular. In the latter, there may be domains with a regular arrangement elements to create the desired frequency, but mutually these domains are oriented differently. Herein, e.g. the transparent high-refractive index particles in the case of a photonic optical structure or e.g. the metal elements in case of a plasmonic optical structure are herein also indicated as elements. These elements may constitute the photonic optical structure or plasmonic optical structure.

As an alternative way to reduce the formation of bi-excitons, one can use a photonic crystal to locally reduce the blue flux. If the photonic crystal is built such that it has an optical bandgap e.g. around 450 nm, those modes will be "forbidden" within the photonic crystal. In other words the local PDOS of frequencies resonant with the blue (or UV) LED source is reduced, which will lead to a reduced blue flux. In this case, effectively more QDs are needed to still get sufficient conversion of blue to yellow/red light.

Saturation quenching as observed for QDs is fairly unique to QDs and does not happen to dyes or rare-earth phosphors, which generally show self-induced transparency upon saturation (strongly reduced absorption at the excitation wavelength once in the excited state).

Hence, in a first aspect the invention provides a lighting device ("device") comprising:
a) a light converter (or "wavelength converter") comprising a light receiving face;
b) a solid state light source configured to generate a light source light with especially a photon flux of at least 10 W/cm$^2$, like at least 20 W/cm$^2$, even more especially at least 50 W/cm$^2$, at the light receiving face, wherein the light converter is configured to convert at least part of the light source light into light converter light having a first frequency, wherein the light converter comprises a semiconductor quantum dot ("quantum dot") in an optical structure, especially selected from a photonic crystal structure and a plasmonic structure, and wherein the quantum dot especially has a quantum efficiency of at least 80%, such as at least 85, even more especially at least 90%, like at least 95%.

Especially, the optical structure is configured to increase the photon density of states (PDOS) in the light converter and resonant with the first frequency. Especially, the optical structure is configured to locally increase the photon density of states (PDOS) in the vicinity of the quantum dot and resonant with the first frequency, for reducing saturation quenching. The phrase "wherein the optical structure is configured to increase the photon density of states in the light converter and resonant with the first frequency" especially indicated that the optical structure increase the PDOS of states, especially (locally) at the quantum dot. This optical structure with these states has a specific frequency which is resonant with a frequency of the emission light of the quantum dot.

Hence, herein the capability of photonic and plasmonic materials to enhance the radiative decay rates of QDs to prevent saturation quenching is used. Surprisingly, it appears that with such optical structures the efficiency of efficiently quantum dots can be maintained and the efficacy of the lighting device can be high. Whereas in prior art systems highly efficient quantum dots may show a substantially reduced efficiency, in the present optical structures the efficiency may remain high, even under substantial illumination conditions, such as at least 10 W/cm$^2$, like at least 20 W/cm$^2$, even more especially at least 50 W/cm$^2$. Hence, whereas prior art systems with quantum dots under high intensity illumination, e.g. comparable for conventional general lighting applications, the efficiency is low, with the present invention, the efficiency (or efficacy) can be very high. Further, with increasing power of the light source light on the light converter, over a large range of intensities, such as in the range of 20-400 W/cm$^2$, there may be no substantial decrease in efficacy, other than expected based upon heating of the light converter.

In a further aspect, the invention also provides the light converter per se, i.e. a light converter comprising a light receiving face configured to receive light source light from a light source, wherein the light converter is configured to convert at least part of the light source light into light converter light having a first frequency, wherein the light converter comprises a semiconductor quantum dot in an optical structure selected from a photonic crystal structure and a plasmonic structure. Especially, the optical structure is configured to increase the photon density of states (PDOS) in the light converter and resonant with the first frequency. Especially, the optical structure is configured to locally increase the photon density of states (PDOS) at the quantum dot and resonant with the first frequency, for reducing saturation quenching. Further, especially the quantum dot has a quantum efficiency of at least 80%, such as at least 85, even more especially at least 90%, like at least 95%.

Therefore, the invention also provides the use of a light converter comprising a semiconductor quantum dot in an optical structure selected from a photonic crystal structure and a plasmonic structure, wherein the optical structure is configured to increase the photon density of states in the vicinity of the quantum dot and resonant with the first frequency for reducing saturation quenching, and wherein the quantum dot has a quantum efficiency of at least 80%, such as at least 85, even more especially at least 90%, such as at least 95%, to prevent saturation quenching of the quantum dot.

The light converter comprises an optical structure. The term "optical structure" may also relate to a plurality of identical or a plurality of different optical structures. The light converter may especially include one or more of a photonic crystal structure and a plasmonic structure. Hence, also a combination of these (two) structures may be applied, either in a single combined structure and/or a separate structures (or domains) within the light converter.

Photonic crystals or structures are periodic optical nanostructures that affect the motion of photons in much the same way that ionic lattices affect electrons in solids. Plasmonic structures can generate surface plasmons, which are produced from the interaction of light with metal-dielectric materials. Under specific conditions, the incident light couples with the surface plasmons to create self-sustaining, propagating electromagnetic waves known as surface plasmon polaritons (SPPs). Both structures can be considered metamaterials. Both materials can interact with light at specific frequencies (or wavelengths), at which those materials can be tuned. The person skilled in the art knows how to make these materials. Hence, those metamaterials can be tuned at the emission frequency of the quantum dot included in the optical structure and locally increase the PDOS.

The light converter light is at least generated by the quantum dot(s), which provide luminescence upon excitation by the light source light. Further information about quantum dots and the light source can be found below. Hence, the light converter light at least includes light generated by the quantum dot(s). However, the light converter may also include one or more luminescent materials other than quantum dots (that are comprised by the optical structure). Hence, the light converter light may also include luminescence from other luminescent material than the quantum dots that are comprised by the optical structure.

The (frequency or wavelength) of the optical structures is especially designed to be resonant with the frequency (or wavelength) of the first frequency (of the light converter light). In general, this first frequency of the light converter light will be unequal to the frequency of the light source light. Especially, this frequency will be lower (i.e. the wavelength will be longer (down conversion principle).

The light converter may essentially consist of the optical structure but may optionally also include other features, such as one or more of a luminescent material layer, an optical lens, an optical filter, etc. Further, the light converter may comprise a single regular optical structure or a plurality of regular optical structures. The plurality of optical structures may be substantially identical, i.e. especially resonant with the first frequency.

However, the light converter may also comprise a plurality of (different) optical structures that are resonant with a plurality of (different) first frequencies. In this way, different emission frequencies/wavelength within the bandwidth of the emission of the quantum dots may become resonant with the frequency/frequencies of the optical structures. Alternatively or additionally, the (plurality of) quantum dots may provide different colors, such as two or more of blue, green, yellow, orange, and red. The wavelength converter may also be configured with optical structures that are resonant with different frequencies of different quantum dots that provide emission at different wavelength within the visible spectrum. The wavelength converter may thus comprise a single optical structure or a plurality of optical structures. The plurality of optical structures may be available within one (extended) optical structure with different periodicities, but may alternatively or additionally also be provided in different domains, or even within different particles within the light converter. Hence, in an embodiment the light converter comprises a plurality of (mutually) different semiconductor quantum dots configured to convert at least part of the light source light into light converter light having a distribution of first frequencies.

In a specific embodiment, the light converter may comprise a plurality of quantum dots in the optical structure, wherein the optical structure comprises a plasmonic structure, and wherein the plasmonic structure is an irregular plasmonic structure. An advantage of an irregular plasmonic structure is that light converter light may escape in different directions. However, alternatively or additionally the optical structure may also comprise regular plasmonic structure.

Alternatively or additionally, the light converter may comprise a polycrystalline photonic crystal structure comprising a plurality of quantum dots. As indicated above, the wavelength converter may thus comprise a single optical structure, which may in the case of a photonic crystal be or include a single crystal photonic crystal. However, the light converter may thus also include a polycrystalline photonic crystal structure. This may be like an (irregular) system, with differently oriented crystalline domains, but it may also include crystalline photonic particles that are embedded in the light converter.

Hence, in an embodiment the light converter comprises a plurality of optical structure domains, wherein the optical structure domains are configured to increase the photon density of states at one or more quantum dots and resonant with the first frequency of said one or more quantum dots. These domains may or may not form a super structure. However, adjacent domains may have different orientations and/or different optical frequencies (to be resonant with the QD emission frequency). The different domains may in an embodiment be grown or generated as such. However, in another embodiment a material comprising a regular optical structure may be processed into particles. Such particles may e.g. be embedded in a host material. In such way a light converter may be provided with a kind of polycrystalline optical structure.

Especially for plasmonic structures it may be desirable to have the quantum dot core at a non-zero distance from the plasmonic elements that constitute the plasmonic structure. Especially, the shortest distance between the core and a plasmonic element, such as a metal (plasmonic) element, may be at least 5 nm, such as at least 10 n. This may for instance be achieved by a coating on the core, such as in the case of a core-shell quantum dot. Bare cores, i.e. bare quantum dots, may also be applied but are thus especially arranged at a shortest distance of at least 5 nm of the plasmonic elements. Such coating or shell may e.g. a silica coating or shell, though the quantum dot may also be part of a larger structure, such as a silica structure. In these ways, the distance between the quantum dot core and the plasmonic elements can be easily tuned. Thereby, also the optimal distance between the core and the elements of the optical structure can be tuned. It further appears that some coatings on the quantum dots may provide further advantageous effects, especially in terms of stability and efficiency. Hence, in an embodiment the quantum dot comprises a silica coating. Other coatings than silica, like alumina, titania, or a combinations of two or more coating, may also be possible. Note that the quantum dots as described herein may also include core-shell quantum dots or QD rods (which may also be of the core-shell type) (see also below). Such coated quantum dots may be included in optical structure. Alternatively, the coating may form part of the optical structure. For instance, one may grow the optical structure around the quantum dot(s) and thereby provide the optical structure and implicitly the coating. Hence, in a further embodiment the optical structure comprises a silica structure.

In a specific embodiment, the quantum dot has a shortest distance to a metallic structure comprised by the optical structure of at least 5 nm, especially at least 10 nm, even more especially at least 15 nm. Especially in the case of plasmonic structures, metal elements may be used. Hence, in such light converter, especially the quantum dots are arranged at a distance of at least 5 nm, especially at least 10 nm, even more especially at least 15 nm. This appears to (further) enhance the efficiency. Too low distances may provide a non-radiative decay path. Especially, the herein indicated distance refers to the shortest distance, even more especially a number averaged shortest distance. Further, as indicated above the distance is especially the shortest distance between the QD core and the (metal) plasmonic element. As also indicated above, to obtain such minimum distance, e.g. a coating (like a shell) or a structure around the bare QDs may be applied. Alternatively or additionally, giant quantum dots may be applied.

Hence, in an embodiment the optical structure may comprises one or more of a photonic crystal structure and plasmonic optical structure, wherein said optical structure, such as a plasmonic structure comprises, a silica structure comprising said quantum dots. This may also include a silica structure comprising photonic structure elements (like holes, etc.) and/or plasmonic elements, such as metal structures that may provide the plasmonic optical structure. Especially said quantum dots (more precisely quantum dot cores) have (in such structure) a shortest distance to a metallic structure (or other plasmonic structure) and/or photonic crystal structure element comprised by the optical structure (30) of at least 5 nm.

In a specific embodiment, the quantum dot(s) has (have) a quantum efficiency of at least 90%, even more especially at least 95%. Even then the efficiency (or efficacy) of the light converter and/or lighting device may be very high with the presently provided solution. The quantum dot(s) may have in the light converter a radiative decay time of 4 ns or less, such as 2 ns or less, or even 1 ns or less. Hence, outside the light converter, or more especially, outside of the optical structures, the radiative decay of the emission may be in the range of at least 10 ns, such as at least 15 ns, like at least 20 ns, such as in the range of 15-50 ns, such as 20-40 ns. However, within the optical structures as described herein, the radiative lifetime may be reduced substantially, such as in the range of ⅕ or less, or even 1/10 or less of the original radiative decay time. To the best of our knowledge, there are no examples known of reduction of QD saturation by these photonic or plasmonic structures.

The invention enables efficient (QD-converted) LED light sources at high flux densities, for example LED lamps, spot lights, outdoor lighting, automotive lighting and/or laser applications.

The term "quantum dots" or "luminescent quantum dots" may also refer to a combination of different type of quantum dots, i.e. quantum dots that have different spectral properties. The QDs are herein also indicated as "wavelength converter nanoparticles". The term "quantum dots" especially refer to quantum dots that luminescence in one or more of the UV, visible and IR (upon excitation with suitable radiation, such as UV radiation).

The quantum dots or luminescent nanoparticles, which are herein indicated as wavelength converter nanoparticles, may for instance comprise group II-VI compound semiconductor quantum dots selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of (core-shell quantum dots, with the core selected from the group consisting of) GaN, GaP, GaAs, AlN, AlP, AlAs, InN, InP, InGaP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of (core-shell quantum dots, with the core selected from the group consisting of) $CuInS_2$, $CuInSe_2$, $CuGaS_2$, $CuGaSe_2$, $AgInS_2$, $AgInSe_2$, $AgGaS_2$, and $AgGaSe_2$. In yet a further embodiment, the luminescent nanoparticles may for instance be (core-shell quantum dots, with the core selected from the group consisting of) I-V-VI2 semiconductor quantum dots, such as selected from the group consisting of (core-shell quantum dots, with the core selected from the group consisting of) $LiAsSe_2$, $NaAsSe_2$ and $KAsSe_2$. In yet a further embodiment, the luminescent nanoparticles may for instance be core-shell quantum dots, with the core selected from the group consisting of) group (IV-VI compound semiconductor nano crystals such as SbTe. In a specific embodiment, the luminescent nanoparticles are selected from the group consisting of (core-shell quantum dots, with the core selected from the group consisting of) InP, $CuInS_2$, $CuInSe_2$, CdTe, CdSe, CdSeTe, $AgInS_2$ and $AgInSe_2$. In yet a further embodiment, the luminescent nanoparticles may for instance be one of the group (of core-shell quantum dots, with the core selected from the group consisting of) II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

The luminescent nanoparticles (without coating) may have dimensions in the range of about 2-50 nm, such as 2-20 nm, especially 2-10 nm, even more especially 2-5 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 2-5 nm). The term "dimensions" especially relate to one or more of length, width, and diameter, dependent upon the shape of the nanoparticle.

In an embodiments, the wavelength converter nanoparticles have an average particle size in a range from about 1 to about 1000 nanometers (nm), and preferably in a range from about 1 to about 100 nm. In an embodiment, nanoparticles have an average particle size in a range from about 1 to about 20 nm. In an embodiment, nanoparticles have an average particle size in a range from about 1 to about 10 nm.

Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or $CuInSe_2$, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. Here, the term "different types" may relate to different geometries as well as to different types of semiconductor luminescent material. Hence, a combination of two or more of (the above indicated) quantum dots or luminescent nano-particles may also be applied.

One example, such as derived from WO 2011/031871, of a method of manufacturing a semiconductor nanocrystal is a colloidal growth process. Colloidal growth occurs by injection an M donor and an X donor into a hot coordinating solvent. One example of a preferred method for preparing mono disperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals that can be obtained has a narrow size distribution of diameters. The small size distribution of diameters can also be referred to as a size. Preferably, a mono disperse population of particles includes a population of particles wherein at least about 60% of the particles in the population fall within a specified particle size range.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal. Any of the materials indicated above may especially be used as core. Therefore, the phrase "core-shell quantum dots, with the core selected from the group consisting of" is applied in some of the above lists of quantum dot materials. The term "core-shell" may also refer to "core-shell-shell", etc . . . , including gradient alloy shell, or dots in rods, etc.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

In an embodiment, the surrounding "shell" material can have a band gap greater than the band gap of the core material. In certain other embodiments, the surrounding shell material can have a band gap less than the band gap of the core material.

In an embodiment, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific wavelength converter nanoparticles, based on semiconductors.

In an embodiment, semiconductor nanocrystals preferably have ligands attached thereto, such as e.g. described in WO 2011/031871. In an embodiment, the ligands can be derived from the coordinating solvent used during the growth process. In an embodiment, the surface can be modified by repeated exposure to an excess of a competing coordinating group to form an overlayer.

For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, carboxylic acids, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

More specifically, the coordinating ligand can have the formula:

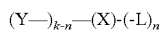

wherein k is 2, 3 4, or 5, and n is 1, 2, 3, 4 or 5 such that k-n is not less than zero; X is O, OS, O—Se, O—N, O—P, O—As, S, S═O, S O 2, Se, Se═O, N, N═O, P, P═O, C═O As, or As═O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

Further ligands may especially be one or more of oleic acid, and tri-octyl phosphine, and tri-octyl phosphine oxide. Hence, ligands may especially be selected from the group of acids, amines, phosphines, phosphine oxides and thiols.

A suitable coordinating ligand can be purchased commercially or prepared by ordinary synthetic organic techniques, for example, as described in J. March, Advanced Organic Chemistry. Other ligands are described in U.S. patent application Ser. No. 10/641,292 for "Stabilized Semiconductor Nanocrystals", filed 15 Aug. 2003, which issued on 9 Jan. 2007 as U.S. Pat. No. 7,160,613, which is hereby incorporated by reference in its entirety. Other examples of ligands include benzylphosphonic acid, benzylphosphonic acid including at least one substituent group on the ring of the benzyl group, a conjugate base of such acids, and mixtures including one or more of the foregoing. In an embodiment, a ligand comprises 4-hydroxybenzylphosphonic acid, a conjugate base of the acid, or a mixture of the foregoing. In an embodiment, a ligand comprises 3,5-di-teri-butyl-4-hydroxybenzylphosphonic acid, a conjugate base of the acid, or a mixture of the foregoing. Additional examples of ligands that may be useful with the present invention are described in International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand and Method", each of the foregoing being hereby incorporated herein by reference.

The above described organic ligands are ligands with which the QD may start, e.g. in an organic solvent, and which may be exchanged in the exchange process to inorganic ligands.

The wavelength converter or wavelength converter element (or more precisely the wavelength converter nanoparticles) is (are) radiationally coupled to the light source (or, as indicated above, a plurality of light sources). The term "radiationally coupled" especially means that the light source and the wavelength converter are associated with each other so that at least part of the radiation emitted by the light source is received by the wavelength converter (and at least partly converted into luminescence). The term "luminescence" refers to the emission which emits the wavelength converter nanoparticles emit upon excitation by the light source light of the light source. This luminescence is herein also indicated as converter light (which at least comprises visible light, see also below).

The wavelength converter will in general also be configured downstream of the light source. The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The device is especially configured to generate device light, which at least partly comprises the converter light, but which may optionally also comprise (remaining) light source light. For instance, the wavelength converter may be configured to only partly convert the light source light. In such instance, the device light may comprise converter light and light source light. However, in another embodiment the wavelength converter may also be configured to convert all the light source light.

Hence, in a specific embodiment, the lighting device is configured to provide lighting device light comprising both light source light and converter light, for instance the former being blue light, and the latter comprising yellow light, or yellow and red light, or green and red light, or green, yellow and red light, etc. In yet another specific embodiment, the lighting device is configured to provide only lighting device light comprising only converter light. This may for instance happen (especially in transmissive mode) when light source light irradiating the wavelength converter only leaves the downstream side of the wavelength converter as converted light (i.e. all light source light penetrating into the wavelength converter is absorbed by the wavelength converter).

The term "wavelength converter" (or "light converter") may also relate to a plurality of wavelength converters. These can be arranged downstream of one another, but may also be arranged adjacent to each other (optionally also even in physical contact as directly neighboring wavelength converters). The plurality of wavelength converters may comprise in an embodiment two or more subsets which have different optical properties. For instance, one or more subsets may be configured to generate wavelength converter light with a first spectral light distribution, like green light, and one or more subsets may be configured to generate wavelength converter light with a second spectral light distribution, like red light. More than two or more subsets may be applied. When applying different subsets having different optical properties, e.g. white light may be provided and/or the color of the device light (i.e. the converter light and optional remaining light source light (remaining downstream of the wavelength converter). Especially when a plurality of light sources is applied, of which two or more subsets may be individually controlled, which are radiationally coupled with the two or more wavelength converter subsets with different optical properties, the color of the device light may be tunable. Other options to make white light are also possible (see also below).

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light.

In a specific embodiment, the light source comprises a solid state LED light source (such as a LED or laser diode).

The term "light source" may also relate to a plurality of light sources, such as 2-20 (solid state) LED light sources. Hence, the term LED may also refer to a plurality of LEDs.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
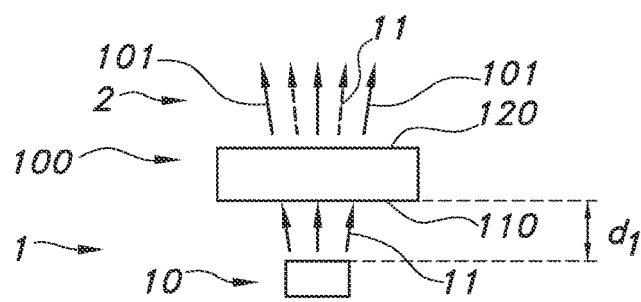
FIGS. 1a-1c schematically depict some embodiments of the lighting device.
Figure 1B:
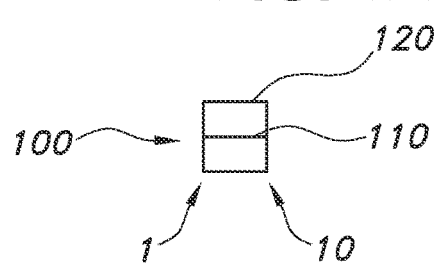
Figure 1C:
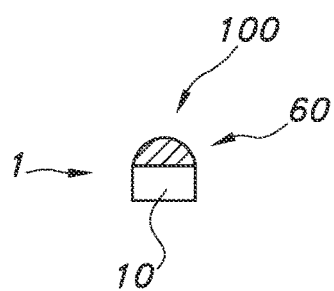

FIGS. 1a-1c schematically depict some embodiments of the lighting unit. The lighting unit is indicated with reference 1; the light source with reference 10 and the light converter with reference 100. The light source may e.g. a LED with a die (not depicted) from which light source light emanates. The light source light generated by the light source 10 is indicated with reference 11. There may be a non-zero distance between the light converter 100 and the light source. The distance is indicated with reference d1, and may be in the range of 0.1 mm-10 cm. However, this distance may also be zero, as schematically depicted in FIG. 1b.

The light converter may include a light receiving face 110, which is directed to the light source 10, and a light exit face 120 (in general opposite of the light receiving face 110). From this face light converter light 101 may emanate. However, it is not excluded that this light may also escape from one or more other faces, including the light receiving face. However, especially the light receiving face may be directed to the light source, and the light exit face may be directed to the exterior of the lighting device. The light receiving face 110 is configured upstream of the light exit face 120, and both are configured downstream of the light source 10. The light escaping from the converter at the downstream side thereof, i.e. escaping from the light exit face 120 may at least include the light converter light 101, which includes emission form the quantum dots (not depicted; see below), but may optionally also include non-converted light source light 11. This may especially relevant when the light source light 11 includes visible light, like blue light. The combination of light source light and light converter light is indicated with reference 2. FIG. 1c includes the wavelength converter in a dome 60. Or, the dome 60 may be the light converter 100. The dome may include a polymeric material, a silicone material, or an epoxy material, etc. FIGS. 1b and 1c schematically depicted embodiments with a substantially zero distance between the light converter and light source.

Note that in the configurations of FIGS. 1a-1c, in principle also more than one light source 10 may be applied. The term light source, as indicated above, may also relate to a plurality of light sources. Further optical elements and or luminescent material may be applied, but are not depicted in these schematic drawings for the sake of clarity.

Figure 2A:
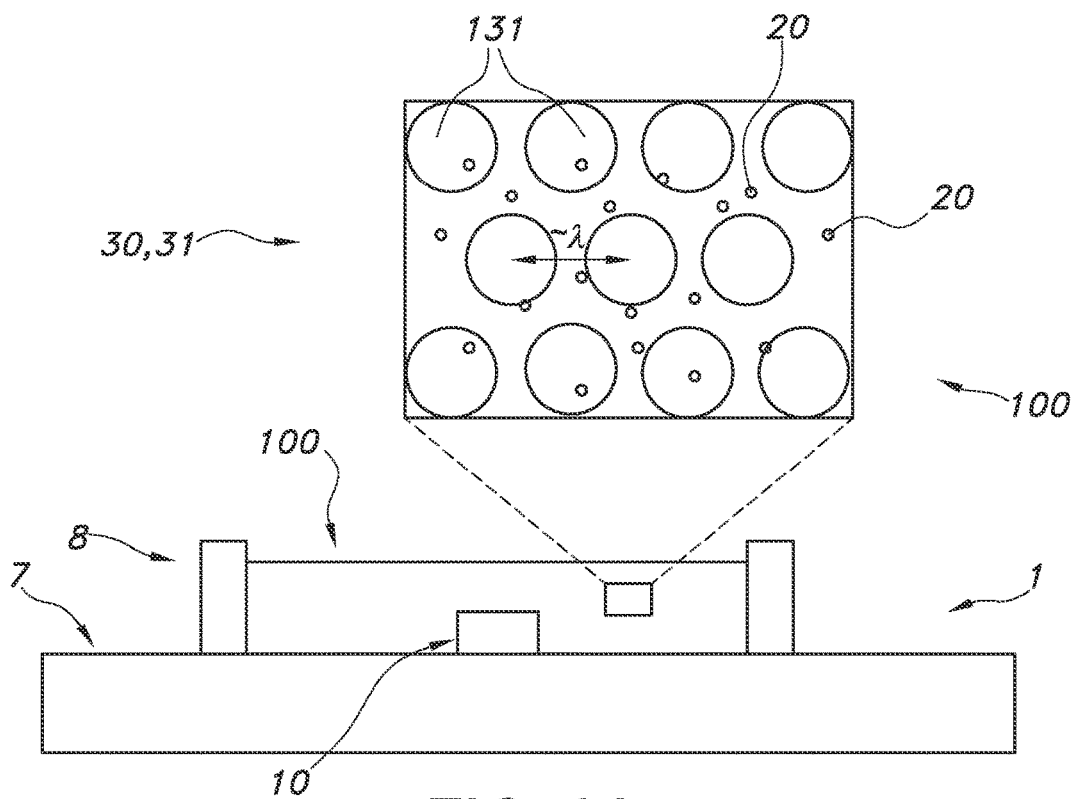
FIGS. 2a-2b schematically depict an LED package with a phosphor dispensed on top, including QDs (red dots), and (2a) a photonic crystal consisting of a regular structure of high-refractive index spheres (periodicity is ~wavelength of visible light, λ), or (2b) a plasmonic structure consisting of eg metal nanopillars or particles of gold or silver. The plasmonic nanostructures may be in a periodic structure, but a random orientation is also possible.
Figure 2B:
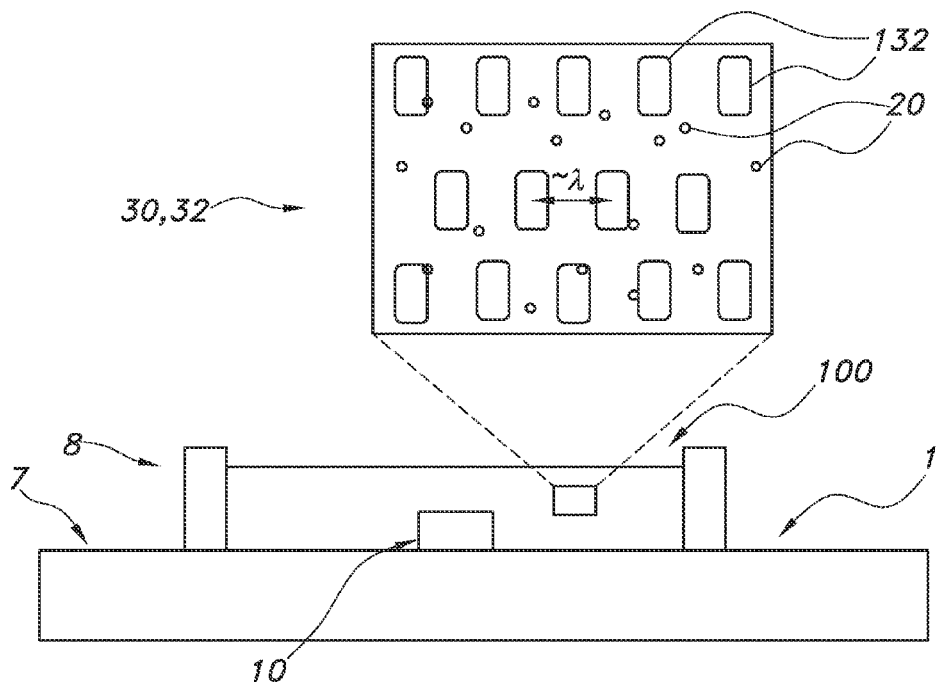

FIGS. 2a-2b schematically depict an LED package with a phosphor dispensed on top, including QDs (small dots), and optical structures 30, with in FIG. 2a a photonic crystal consisting of a photonic (regular) structure 31 of elements 131, such as of high-refractive index spheres (periodicity is ~wavelength of visible light, λ), and within FIG. 2b a plasmonic structure 32 consisting of elements 132, e.g. metal nanopillars or particles of gold or silver, as example of the optical structure 30. The plasmonic nanostructures 32 may be in a periodic structure, but a random orientation is also possible. Here, by way of example the light source 10 is especially a LED, which is configured on a board 7. In these embodiments, further, by way of example the light converter 100 is arranged within a cup 8. Enlargement are shown to indicate some of the relevant structures in more detail. Note that the quantum dots 20 may not need to be regularly arranged, although in embodiments they may be. The photonic crystal is indicated with reference 31 and the plasmonic structure is indicated with reference 32. The indicated λ shows the distance between the elements that constitute the optical structure, be it a plasmonic structure or a photonic crystal. This distance or period scales with the frequency. Therefore, herein also the term frequency is used. The frequency of the optical structure is tuned at the emission of the QD. Herein, the drawings schematically show regular structures or domains with regular structures. However, the optical structures may also include irregularity, in the sense that there are domains with regularly arranged elements, but the domains mutually differ in orientation and/or frequency. Hence, FIGS. 2a-2b are schematic drawings of how QDs would be dispersed into a photonic crystal medium (FIG. 2a) or a plasmonic structure, applied (dispensed) directly on top of the LED (eg with a silicone as matrix medium).

Figure 3A:
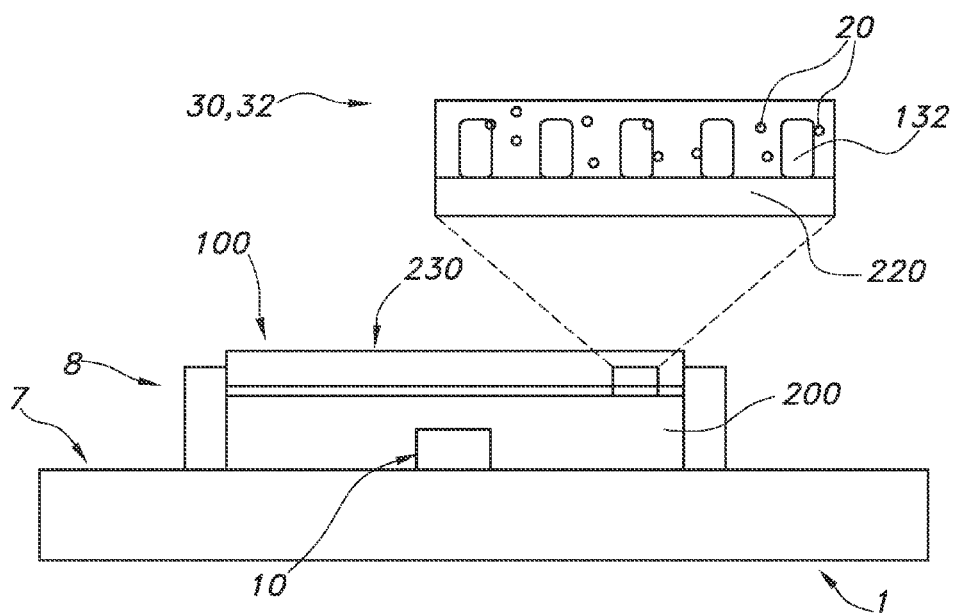
FIGS. 3a-3c schematically depict various other embodiments of an LED-QD-plasmonic (or photonic) architecture as described in text above.
Figure 3B:
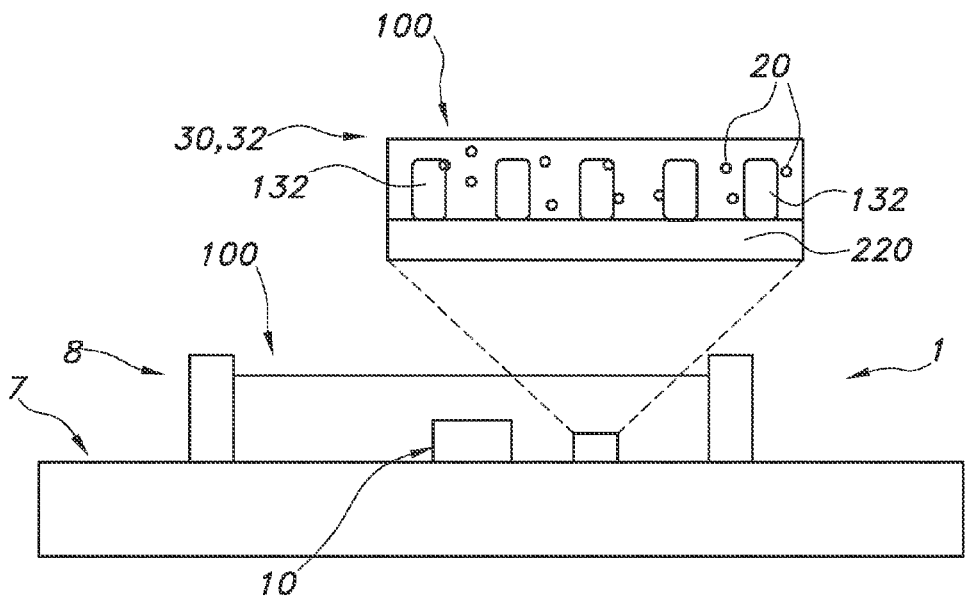
Figure 3C:
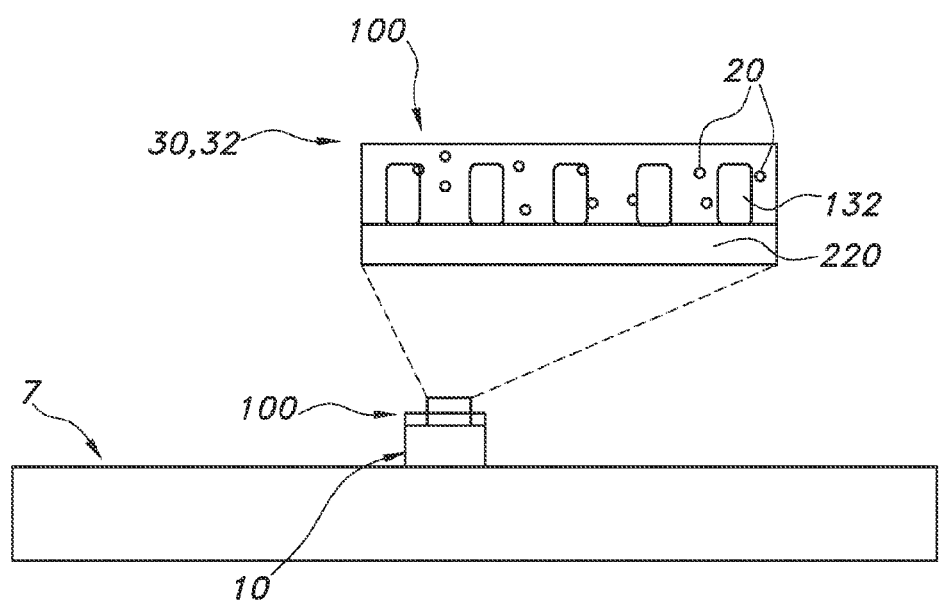

FIGS. 3a-3c schematically depict various other embodiments of an LED-QD-plasmonic (or photonic) architecture as described in text above. In FIG. 3a a plasmonic structure 32 is included in the light converter. The plasmonic structure is arranged on a substrate 220, which may be transparent or translucent, especially glass or another light transmissive material. Further, optionally two or more luminescent materials may be available. A first luminescent material 200 may e.g. provide yellow emission, and the optical structure 30 may, as second luminescent material 230, may e.g. provide red emission. Hence, FIG. 3a may schematically depict a glass (or other material) component on which the photonic/plasmonic structure is applied (together with QDs).

In FIG. 3b, the optical structure is arranged within the light converter 100. Hence, FIG. 3b may schematically depicts a plasmonic/photonic structure (including QDs) applied next to the LED on board.

FIG. 3c schematically depicts an embodiment wherein the optical structure is directly on a LED die. Hence, FIG. 3c may schematically depict an embodiment wherein the plasmonic or photonic structures directly applied on the LED epitaxy.

Other embodiments may alternatively or additionally include e.g. structures where the QDs themselves are actually part of the regular photonic or plasmonic structures. For example, a very regular array or superlattice of QDs could itself be a plasmonic or photonic structure. This effect can also be used to increase the light output per time as the QDs earlier get a chance to emit again. Therefore, this method can also be used to reduce the amount of material needed to achieve a certain level of conversion without running into a problem with saturation.

Figure 4A:
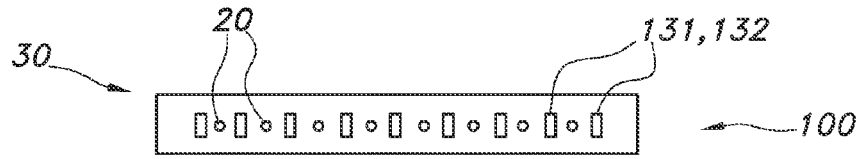
FIGS. 4a-4c schematically depict some further embodiments of the light converter.
Figure 4B:
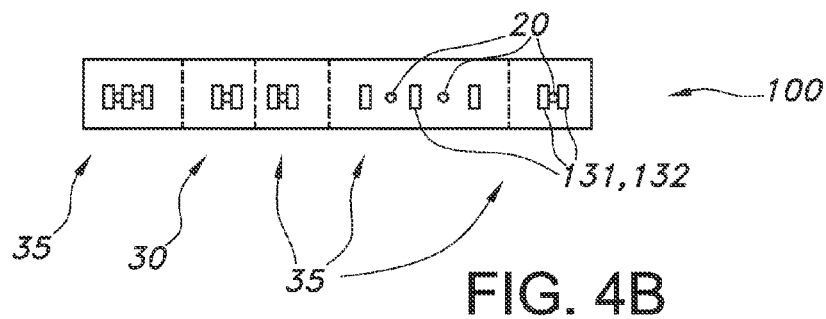
Figure 4C:
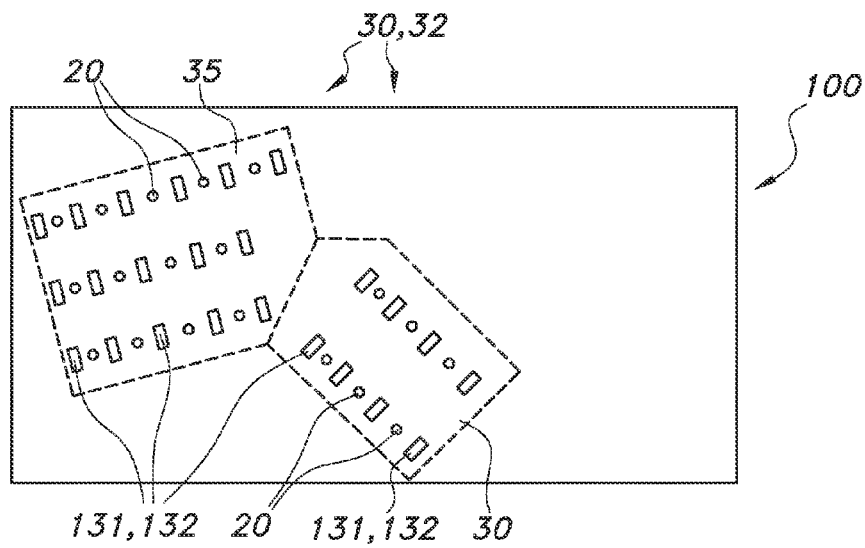

FIGS. 4a-4b schematically depict some further embodiments of the light converter. FIG. 4a schematically depicts a regular plasmonic or photonic crystal as example of optical structure 30. FIG. 4b schematically depicts a multi crystalline photonic crystal structure or an irregular plasmonic structure (here especially an irregular plasmonic structure). Reference 35 indicate different regions of which two or more are mutually differing. FIG. 4c schematically depicts another embodiment of a multi crystalline photonic crystal structure or an irregular plasmonic structure (here especially an irregular plasmonic structure), wherein the orientations of the different regions or domains, indicated with reference 35, are different.

Figure 5:
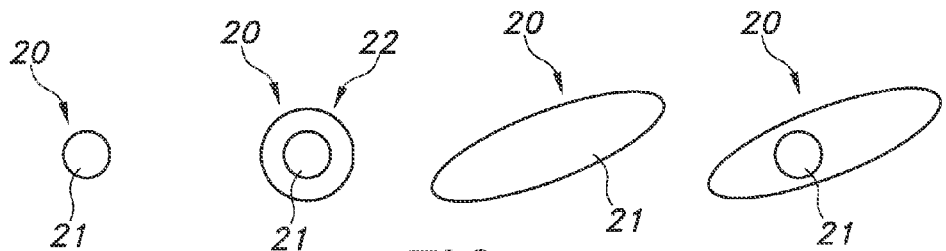
FIG. 5 schematically depicts a non-limiting number of quantum dots The drawings are not necessarily on scale.

FIG. 5 schematically depicts a non-limiting number of quantum dots, with from left to right a quantum dot (bare core or bare dot), a core shell quantum dot (including a giant QD), a quantum rod, and a quantum dot in rod quantum dot. All are indicated with quantum dot 20, with reference 21 indicating the core. The core 21 may provide the luminescence, and the surrounding material may be protective and/or efficiency increasing material as known in the art.

The invention claimed is:

1. A lighting device comprising:
   a) a light converter comprising a light receiving face;
   b) a solid state light source configured to generate a light source light with a photon flux of at least 10 W/cm² at the light receiving face,
   wherein the light converter is configured to convert at least part of the light source light into a light converter light having a first frequency, wherein the light converter comprises a semiconductor quantum dot in an optical structure selected from a photonic crystal structure and a plasmonic structure, wherein the optical structure is configured to increase a photon density of states in the light converter and be resonant with the first frequency for reducing saturation quenching, and wherein the quantum dot has a quantum efficiency of at least 80%.

2. The lighting device-according to claim 1, wherein the light converter comprises a plurality of quantum dots in the optical structure, wherein the optical structure comprises said plasmonic structure, and wherein the plasmonic structure is an irregular plasmonic structure.

3. The lighting device-according to claim 1, wherein the light converter comprises a plurality of quantum dots in the optical structure, wherein the optical structure comprises said plasmonic structure, and wherein the plasmonic structure is a regular plasmonic structure.

4. The lighting device-according to claim 1, wherein the light converter comprises a polycrystalline photonic crystal structure comprising a plurality of quantum dots.

5. The lighting device-according to claim 1, wherein a core of the quantum dot has a shortest distance to a metallic structure comprised by the optical structure of at least 5 nm.

6. The lighting device-according to claim 1, wherein the quantum dot comprises a silica coating or wherein the optical structure comprises a silica structure comprising quantum dots.

7. The lighting device-according to claim 1, wherein the light converter comprises a plurality of different semiconductor quantum dots configured to convert at least part of the light source light into the light converter light having a distribution of first frequencies.

8. The lighting device-according to claim 7, further comprising a plurality of optical structure domains, wherein the optical structure domains are configured to increase the photon density of states in the vicinity of one or more quantum dots—and be resonant with the first frequency of said one or more quantum dots.

9. The lighting device-according to claim 1, wherein the quantum dot has a quantum efficiency of at least 90% and wherein the quantum dot has in the light converter a radiative decay time of 4 ns or less.

* * * * *